US006974744B1

(12) United States Patent
Aram et al.

(10) Patent No.: US 6,974,744 B1
(45) Date of Patent: Dec. 13, 2005

(54) FRINGING CAPACITOR STRUCTURE

(75) Inventors: Farbod Aram, Cupertino, CA (US); Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 25 days.

(21) Appl. No.: 10/836,389

(22) Filed: Apr. 30, 2004

Related U.S. Application Data

(60) Continuation of application No. 10/372,617, filed on Feb. 21, 2003, now Pat. No. 6,784,050, which is a division of application No. 09/765,200, filed on Jan. 18, 2001, now Pat. No. 6,625,006.

(60) Provisional application No. 60/229,533, filed on Sep. 5, 2000.

(51) Int. Cl.$^7$ ........................ H01L 21/8242; H01G 4/20
(52) U.S. Cl. ...................................... 438/240; 361/313
(58) Field of Search .............................. 361/301, 303, 361/306.1, 311–313, 320, 321; 438/240–244, 438/253–255, 306, 307

(56) References Cited

U.S. PATENT DOCUMENTS

| | | | |
|---|---|---|---|
| 3,034,445 A | 5/1962 | Pelladeau | |
| 3,255,324 A | 6/1966 | Ovshinsky | |
| 4,017,820 A | 4/1977 | Ross | |
| 4,409,608 A | 10/1983 | Yoder | |
| 4,937,649 A | 6/1990 | Shiba et al. | |
| 5,172,299 A | 12/1992 | Yamada et al. | |
| 5,208,725 A | 5/1993 | Akcasu | |
| 5,218,506 A | 6/1993 | Harris | |

(Continued)

FOREIGN PATENT DOCUMENTS

DE    76 35 588    11/1976

(Continued)

OTHER PUBLICATIONS

Chan et al., C., "Analysis of MMIC Structures Using an Efficient Iterative Approach", IEEE Transactions on Microwave Theory and Techniques—vol. 36, No. 1, Jan. 1988, pp. PL000451-PL000460.

(Continued)

Primary Examiner—David Nelms
Assistant Examiner—Calvin Lee

(57) ABSTRACT

The present invention provides a circuit and method for a fringing capacitor. The fringing capacitor includes at least two conductor layers spaced apart from each other. Each conductor layer includes at least two portions. The portions include odd ones alternating with even ones. Adjacent odd ones and even ones of the portions are spaced apart. The odd ones of the portions on a first one of the conductor layers are configured to substantially overlay the odd ones of the portions on an adjacent one of the conductor layers. The even ones of the portions on the first one of the conductor layers are configured to substantially overlay the even ones of the portions on the adjacent one of the conductor layers. The odd ones of the portions on the first one of the conductor layers are electrically coupled together and to the even ones of the portions on the adjacent one of the conductor layers, thereby defining a first electrode. The even ones of the portions on the first one of the conductor layers are electrically coupled together and to the odd ones of the portions on the adjacent one of the conductor layers, thereby defining a second electrode. A dielectric is interposed between the first and second electrodes. A guardband is spaced from the first and second electrodes.

10 Claims, 9 Drawing Sheets

U.S. PATENT DOCUMENTS

| | | | |
|---|---|---|---|
| 5,583,359 | A | 12/1996 | Ng et al. |
| 5,903,493 | A | 5/1999 | Lee |
| 6,001,702 | A | 12/1999 | Cook et al. |
| 6,150,707 | A | 11/2000 | Cook et al. |
| 6,266,226 | B1 | 7/2001 | Hayashi |
| 6,266,227 | B1 | 7/2001 | Konushi et al. |
| 6,312,963 | B1 | 11/2001 | Chou et al. |
| 6,410,954 | B1 | 6/2002 | Sowlati et al. |
| 6,414,806 | B1 | 7/2002 | Gowda et al. |
| 6,445,056 | B2 | 9/2002 | Nakashima |
| 6,459,561 | B1 | 10/2002 | Galvagni et al. |
| 6,501,610 | B1 | 12/2002 | Sugawara et al. |
| 6,570,210 | B1 | 5/2003 | Sowlati et al. |
| 6,597,562 | B1 | 7/2003 | Hu et al. |
| 6,635,916 | B2 | 10/2003 | Aton |

FOREIGN PATENT DOCUMENTS

| | | |
|---|---|---|
| DE | 41 13 576 A1 | 10/1991 |
| GB | 995334 | 6/1965 |
| GB | 1 247 985 | 9/1971 |
| GB | 2 060 253 A1 | 4/1981 |
| JP | 42-5946 | 3/1967 |
| JP | 46-24658 | 7/1971 |
| JP | 46-43172 | 12/1971 |
| JP | 52-122674 | 10/1977 |
| JP | 52-122675 | 10/1977 |
| JP | 53-61051 | 6/1978 |
| JP | 54-101153 | 8/1979 |
| JP | 56-16936 | 2/1981 |
| JP | 56-96620 | 8/1981 |
| JP | 57-52120 | 3/1982 |
| JP | 57-157128 | 9/1982 |
| JP | 57-157129 | 9/1982 |
| JP | 58-051552 | 3/1983 |
| JP | 58-56432 | 4/1983 |
| JP | 58-66632 | 5/1983 |
| JP | 58-097854 | 6/1983 |
| JP | 58-159367 | 9/1983 |
| JP | 59-91718 | 6/1984 |
| JP | 59-105341 | 6/1984 |
| JP | 59-132613 | 7/1984 |
| JP | 59-197122 | 11/1984 |
| JP | 59-222959 | 12/1984 |
| JP | 60-1825 | 1/1985 |
| JP | 60-4207 | 1/1985 |
| JP | 60-92604 | 5/1985 |
| JP | 60-102725 | 6/1985 |
| JP | 60-102726 | 6/1985 |
| JP | 60-102727 | 6/1985 |
| JP | 61055936 | 3/1986 |
| JP | 61-259560 | 11/1986 |
| JP | 61263251 | 11/1986 |
| JP | 64-084616 | 3/1989 |
| JP | 64-84616 | 3/1989 |
| JP | 01096943 | 4/1989 |
| JP | 1-120858 | 5/1989 |
| JP | 01-133354 | 5/1989 |
| JP | 2-47024 | 3/1990 |
| JP | 02086160 | 3/1990 |
| JP | 02090561 | 3/1990 |
| JP | 2-178963 | 7/1990 |
| JP | 02178963 | 7/1990 |
| JP | 02191369 | 7/1990 |
| JP | 03096267 | 4/1991 |
| JP | 03133169 | 6/1991 |
| JP | 3-79416 | 8/1991 |
| JP | 03181165 | 8/1991 |
| JP | 3-257855 | 11/1991 |
| JP | 50-42369 | 2/1993 |
| JP | 61-57513 | 6/1994 |

OTHER PUBLICATIONS

Wakayama et al., M., "A 30-MHz Low-Jitter High-Linearity CMOS Voltage-Controlled Oscillator", IEEE Journal of Solid-State Circuits—vol. 22, No. 6, Dec. 1987, pp. PL000461-PL00468.

Aparicio et al., R., "Capacity Limits and Matching Properties of Lateral Flux Integrated Capacitors", Department of Electrical Engineering, California Institute of Technology, Pasadena, CA 91125, USA, 2001 IEEE, pp. PL000434-PL000437.

Wolff et al., "Computer Models For MMIC Capacitors and Inductors", 14th European Microwave Conference, Monday 10th to Thursday 13th, Sep. 1984, Microwave Exhibitions and Publishers Ltd., pp. 853-858.

"Switched-Capacitor-Filter Dynamic Tuning Mechanism", Research Disclosure, Feb. 1987. No. 274, Kenneth Mason Publications Ltd., England.

Sudo, "Interconnect Capacitors and Crosstalk Noises on GAAS LSIS", R & D Center TOSHIBA Corp., VLD87-70, pp. 35-40.

Sakai et al., "Elevated Electrode Integrated Circuits", IEEE Journal of Solid-State Circuits, vol. SC-14, No. 2, Apr. 1979, pp. 301-307.

She et al., IEEE Proceedings—H on "Microwaves, Antennas and Propagation—Interdigital microstrip capacitor as a four-port network", vol. 133, Part H, No. 3, Jun. 1986, pp. 191-197.

Esfandiari et al., IEEE Transactions on "Microwave Theory and Techniques—Design of Interdigitated Capacitors and Their Application to Gallium Arsenide Monolithic Filters", Jan. 1983, vol. MTT-31, No. 1, ISSN 0018-9480, pp. 57-64.

Alley, IEEE Xplore, "Interdigital Capacitors for Use in Lumped-Element Microwave Integrated Circuits", Published May 1970, Issue 1, pp. 7-13.

Matthaei, IEEE Xplore, "Interdigital Band-Pass Filters", Published Nov. 1962, Issue 6, ISSN 0018-9480, pp. 479-491.

Naghed et al., IEEE Transactions on "Microwave Theory and Techniques—Equivalent Capacitances of Coplanar Waveguide Discontinuities and Interdigitated Capacitors Using a Three-Dimensional Finite Difference Method", Dec. 1990, vol. 38, No. 12, ISSN 0018-9480, pp. 1808-1815.

Benedek, IEEE Explore, "Capacitances of a planar multiconductor configuration on a dielectric substrate by a mixed order finite-element method", Published May 1976, vol. 23, Issue 5, ISSN 0098-4094, pp. 279-284.

Benedek, IEEE Explore, "Capacitance of Parallel Rectangular Plates Separated by a Dielectric Sheet", Published Aug. 1972, vol. 20, Issue 8, ISSN 0018-9480, pp. 504-510.

Venema et al., IEEE Transactions on "Microwave Theory and Techniques—Static Capacitance Calculations for a Surface Acoustic Wave Interdigital Transducer in Multilayered Media", Apr. 1978, vol. MTT-26, No. 4, pp. 294-297.

Nguyen et al., IBM Technical Disclosure Bulletin, "Vertical Capacitor VLSI Structure for High Voltage Applications", vol. 32, No. 7, Dec. 1989, pp. 37-41.

IBM Technical Disclosure Bulletin, Sep. 1963, p. 134, "Electrostatic Device", Electrical Devices Sensing FDP.

Bhupendra K. Ahuja, "An Improved Frequency Compensation Technique for CMOS Operational Amplifiers", IEEE J. Solid-State Circuits, vol. SC 18, No. 6, pp. 629-633, Dec. 1983.

Runsheng He, Nersi Nazari and Sehat Sutardja, "A DSP Receiver for 1000BASE-T PHY," Submitted to ISSCC 2001.

S. Sutarja and P.R. Gray, "A pipelined 13-bit, 250-ks/s, 5-V, analog-to-digital converter," IEEE J. Solid-State Circuits, vol. 23, pp. 1316-1323, Dec. 1988.

S.H. Lewis and P.R. Gray, "A piplined 5-Msample/s 9-bit analog to digital converter," IEEE J. Solid-State Circuits, vol. SC-22, pp. 954-961, Dec. 1987.

S.H. Lewis, R. Ramachandran "A 10-b 20-Msample/s Analog-to-Digital Converter," IEEE J. Solid-State Circuits, vol. 27, pp. 351-358, Mar. 1992.

Shiba, Takashi et al. "Study on Transformer Ratio and Capacitance in Equivalent Circuit Model for SAW Transducer." 10th Symposium on Ultrasonic Electronics (Toyko 1989) Japanese Journal of Applied Physics, vol. 29 (1990) Supplement 29-1, pp. 129-132.

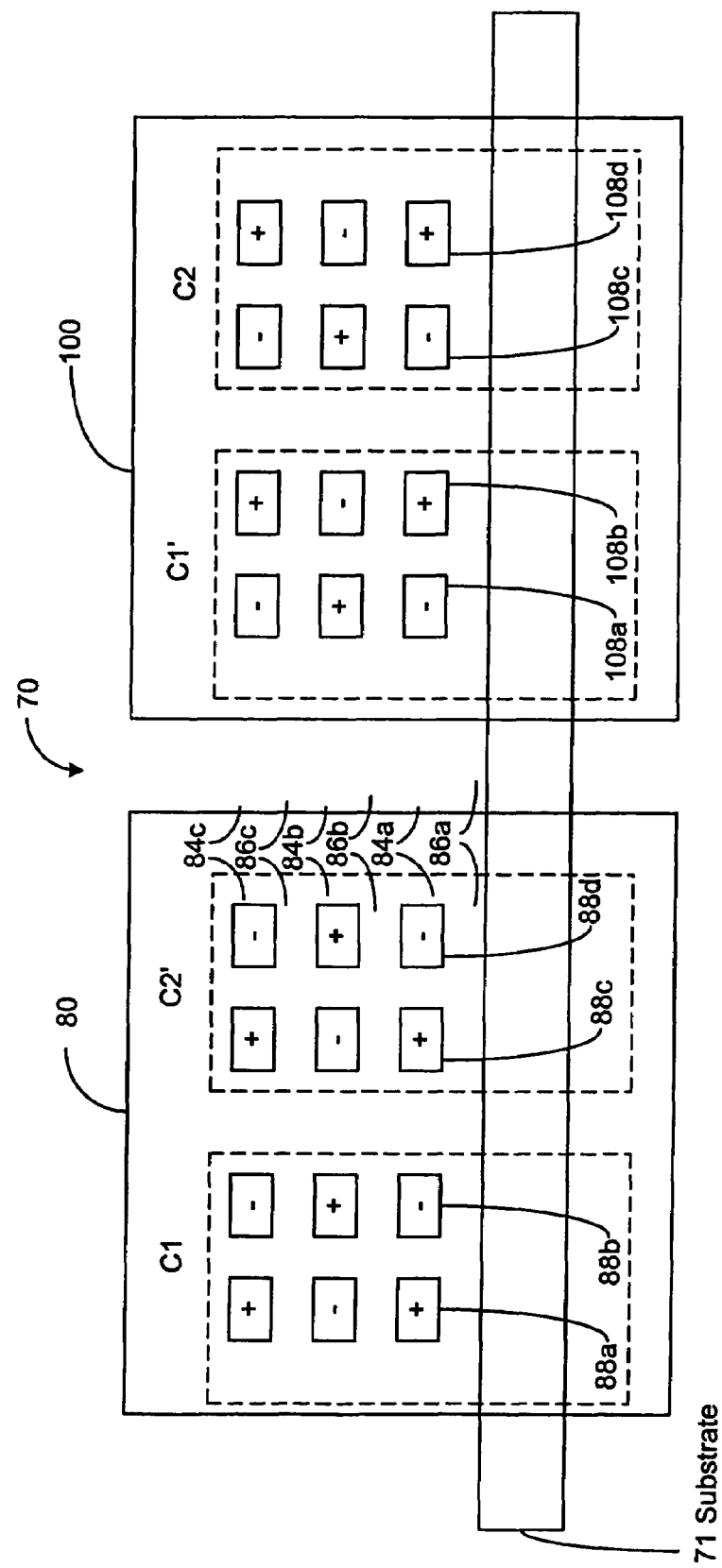

FRINGING CAPACITOR STRUCTURE

CROSS-REFERENCE TO RELATED APPLICATIONS

This application is a continuation of U.S. patent Ser. No. 10/372,617, filed on Feb. 21, 2003, and issued as U.S. Pat. No. 6,784,050 which is a divisional of U.S. patent Ser. No. 09/765,200 filed on Jan. 18, 2001 now U.S. Pat. No. 6,625,006, which claims priority from U.S. Provisional Ser. No. 60/229,533 filed Sep. 5, 2000. The disclosures of the above applications are incorporated herein by reference.

BACKGROUND OF THE INVENTION

1. Field of the Invention

The present invention relates generally to capacitors, and in particular to capacitors that are implemented within a semiconductor device.

2. Discussion of the Related Art

Conventional capacitors that are fabricated on semiconductor devices for storing charge are typically configured as metal-to-metal capacitors (MOMs). Referring to FIG. 1, the construction of a typical MOM 10 is illustrated. The MOM 10 includes two electrodes 12 that are formed on conductor layers 14 and 16 that are separated by a dielectric 18. A substrate 19 forms a base for the MOM 10. In addition to the device capacitance which is formed between the electrodes, there is also an undesirable parasitic capacitance that is formed between the substrate 19 and adjacent electrode. In many conventional devices, the parasitic capacitance may exceed 20% of the value of the capacitance between the electrodes of the capacitor. To increase the value of capacitance, generally either the plate area of the MOM is increased, or the dielectric thickness is decreased. Both of these options have drawbacks. Increasing the plate area causes a further undesirable increase in the parasitic capacitance, while reducing the dielectric thickness requires an extra process step that significantly increases the cost of the device. In addition, the matching characteristics of conventional semiconductor capacitors are deficient due to the non-symmetrical effect of external fields on adjacent capacitors.

SUMMARY OF THE INVENTION

The present invention provides a circuit and method for a fringing capacitor. The fringing capacitor includes at least two conductor layers spaced apart from each other. Each conductor layer includes at least two portions. The portions include odd ones alternating with even ones. Adjacent odd ones and even ones of the portions are spaced apart. The odd ones of the portions on a first one of the conductor layers are configured to substantially overlay the odd ones of the portions on an adjacent one of the conductor layers. The even ones of the portions on the first one of the conductor layers are configured to substantially overlay the even ones of the portions on the adjacent, one of the conductor layers. The odd ones of the portions on the first one of the conductor layers are electrically coupled together and to the even ones of the portions on the adjacent one of the conductor layers, thereby defining a first electrode. The even ones of the portions on the first one of the conductor layers are electrically coupled together and to the odd ones of the portions on the adjacent one of the conductor layers, thereby defining a second electrode. A dielectric is interposed between the first and second electrodes. A guardband is spaced from the first and second electrodes.

For a more complete understanding of the invention, its objects and advantages, reference may be had to the following specification and to the accompanying drawings.

BRIEF DESCRIPTION OF THE DRAWINGS

FIGS. 4A, 4B, and 4C illustrate side and top-views of split-capacitance embodiments of a fringing capacitor in accordance with the principles of the invention.

DETAILED DESCRIPTION OF THE PREFERRED EMBODIMENT

Figure 1:
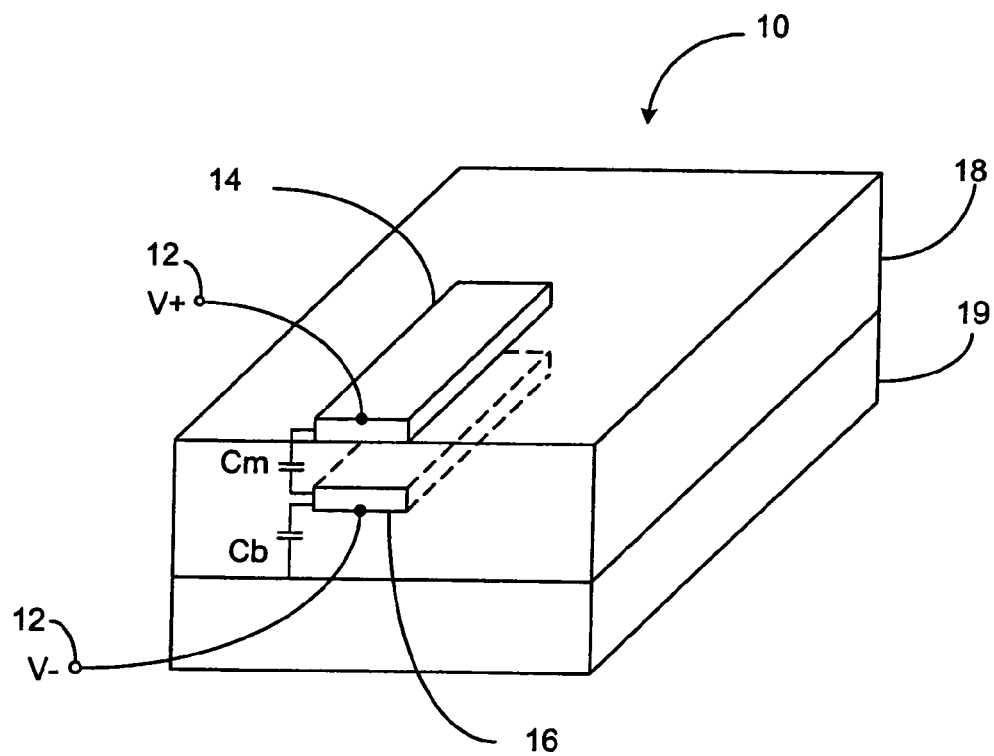
FIG. 1 illustrates a conventional metal-on-metal capacitor.
Figure 2A:
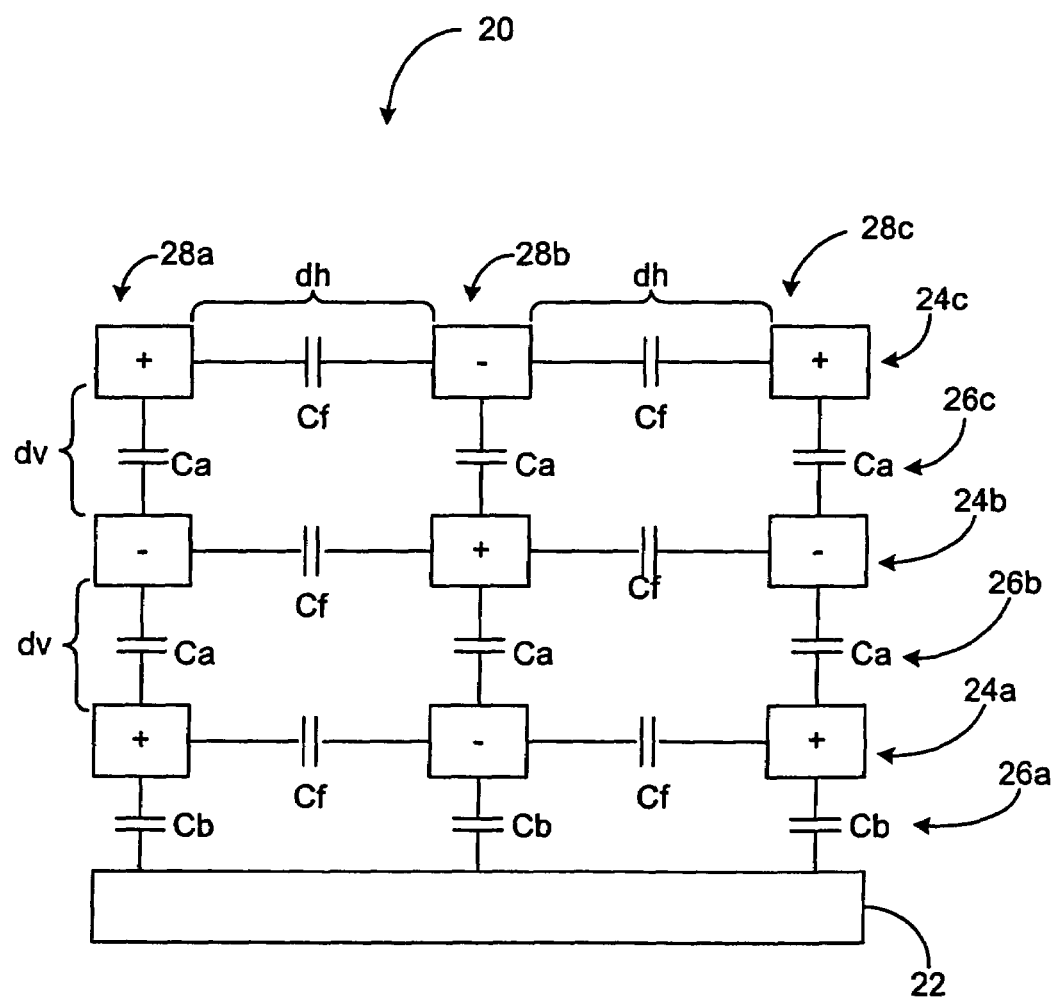
FIG. 2A illustrates a side-view of an embodiment of a fringing capacitor in accordance with the principles of the invention.
Figure 2B:
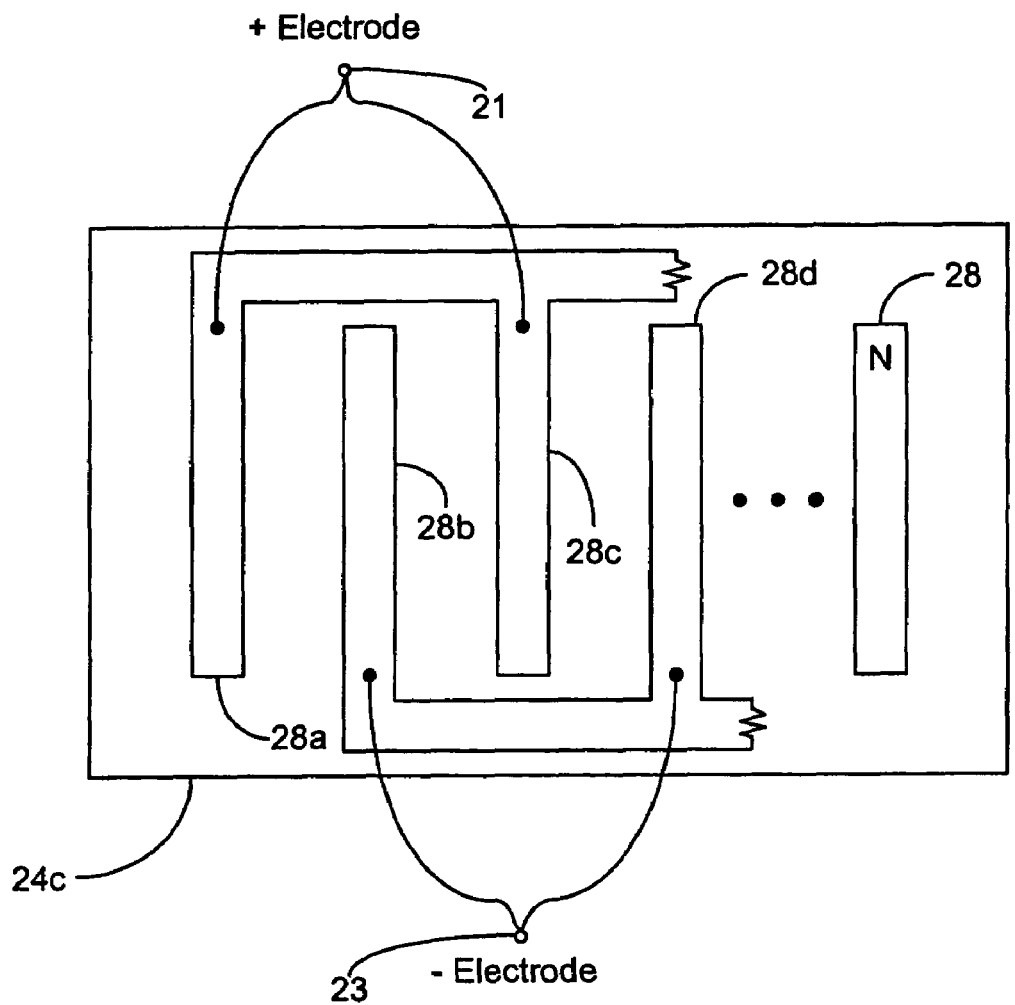
FIG. 2B illustrates a top-view of an embodiment of a fringing capacitor in accordance with the principles of the invention.

Referring to FIGS. 2A and 2B, illustrated are side and top views of a presently preferred embodiment of a fringing capacitor 20 fabricated on a semiconductor substrate 22 in accordance with the principles of the present invention. The fringing capacitor is particularly suitable for fabricating the device by using a conventional thin metal oxide process. The thin metal oxide process advantageously is less costly than complementary metal oxide semiconductor (CMOS) processes. However, using other semiconductor processes such as CMOS are also within the scope of the invention. The fringing capacitor 20 is particularly suitable for applications that require matched capacitors and high-density packaging.

The fringing capacitor 20 has a positive electrode 21 and a negative electrode 23. The positive and negative electrodes 21 and 23 are configured so that the device capacitance is formed between a combination of intralayer conductors as well as interlayer conductors. The fringing capacitor 20 includes two or more conductor layers 24 separated by associated dielectric layers 26 for forming interlayer capacitance. Dielectric layers 26 and conductor layers 24 are alternately stacked upon the substrate 22. A first dielectric layer 26a is deposited on the substrate 22. Then a first conductor layer 24a is fabricated on top of the first dielectric layer 26a. The dielectric layers 26 and conductor layers 24 continue to be alternately deposited to whatever number of layers is selected.

The conductor layers are preferably formed from aluminum, however any suitable conductive material is within the scope of the invention including copper, polysilicon, tungsten, gold, and silicon alloys such as titanium silicide. Fabricated on each of the conductor layers 24 are multiple conductor legs 28 for forming an intralayer capacitance, Cf. The conductor legs 28 are formed to follow substantially parallel paths with a dielectric disposed between them. Adjacent conductor legs 28 are coupled to opposing electrodes. Preferably, the conductor legs 28 are configured to follow straight runs with every other conductor leg being coupled to a common electrode polarity. However, it is within the scope of the invention for the conductor legs 28 to have other path configurations such as circular, L-shaped, and spiral. Adjacent conductor legs are preferably separated approximately by a distance $d_h$ along the path of the conductors so that an intralayer capacitance, Cf, is formed between the adjacent conductor legs. In the presently preferred embodiment, the distance $d_h$ is selected to be 0.3 um.

Similarly, the conductor legs 28 on each layer are arranged to overlay the conductor legs 28 on adjacent conductor layers so that an interlayer capacitance, Ca, is formed between the conductor legs 28 of the adjacent conductor layers. Preferably, the dielectric layer 24 that is sandwiched between the adjacent conductor layers 28 is fabricated with a uniform thickness of $d_v$. In the presently preferred embodiment the dielectric layers 24 are fabricated with a thickness $d_v$ of 1 um. The total capacitance, Cf, of the device is equal to the combination of Ca plus Cf. Preferably, Ca comprises about 20% of the total capacitance and Cf comprises about 80% of the total capacitance.

A parasitic capacitance, $C_b$, is also formed, being caused by the interaction between the substrate 22 and the nearest conductor layer 24. The ratio Cb/Ct provides a figure of merit indicating the quality of the fringing capacitor 20. The lower the value of Cb/Ct, the higher the quality of the fringing capacitor 20. The value of Cb/Ct can be driven lower by increasing the number of conductor legs 28 on each conductor layer 24, and by increasing the number of conductor layers 24.

The fringing capacitor 20 is preferably fabricated with a total of three conductor layers. However, using two or more conductor layers 24 is within the scope of the invention. In conventional semiconductor capacitors, the value of the parasitic capacitance coupled to the substrate typically exceeds 20% of the value of the capacitance formed between the conductor layers. Relying on the fringing capacitance as well as employing multiple conductor layers 24 in the present invention improves the volumetric efficiency and reduces the value of parasitic capacitance, Cb, to less than 20% of the total capacitance.

Figure 3A:
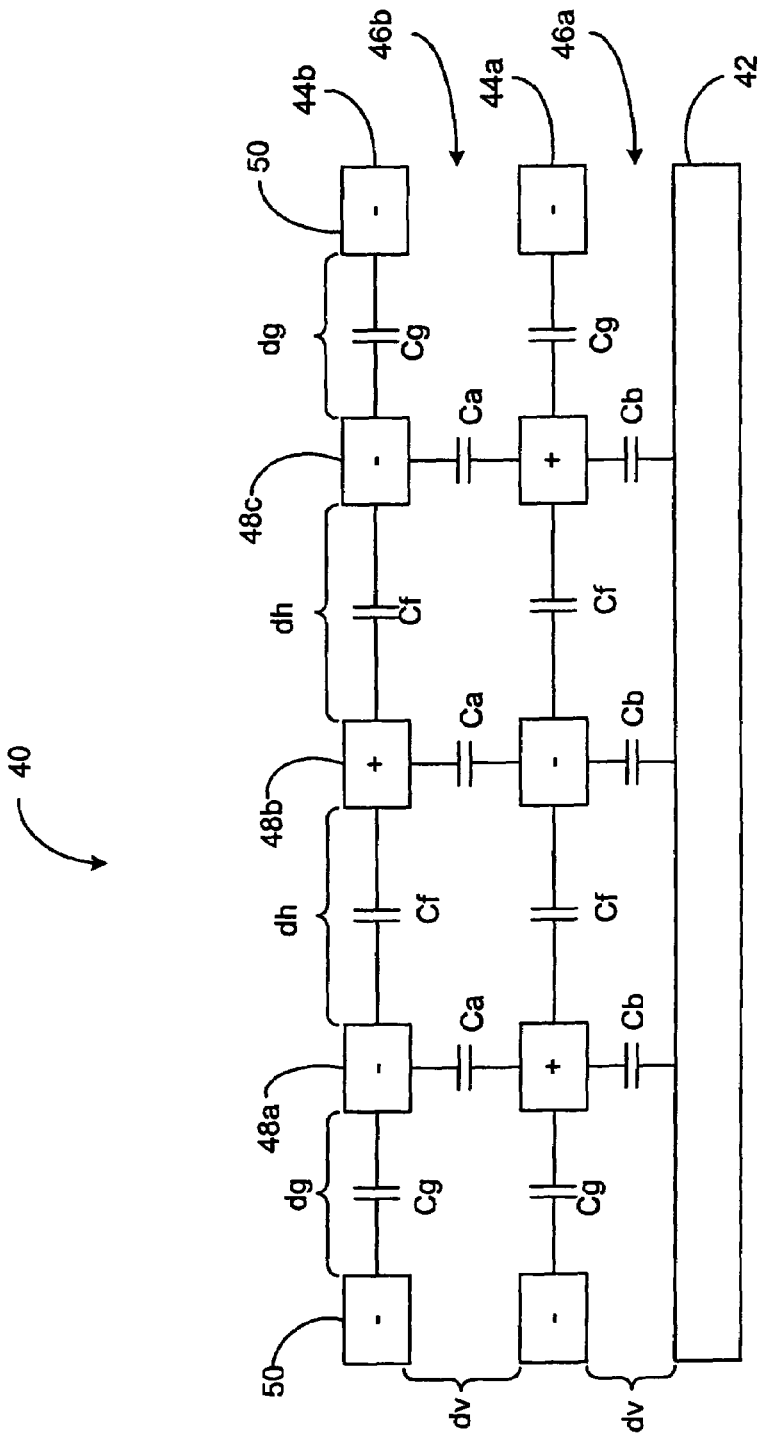
FIG. 3A illustrates a side-view of a presently preferred embodiment of a fringing capacitor in accordance with the principles of the invention.
Figure 3B:
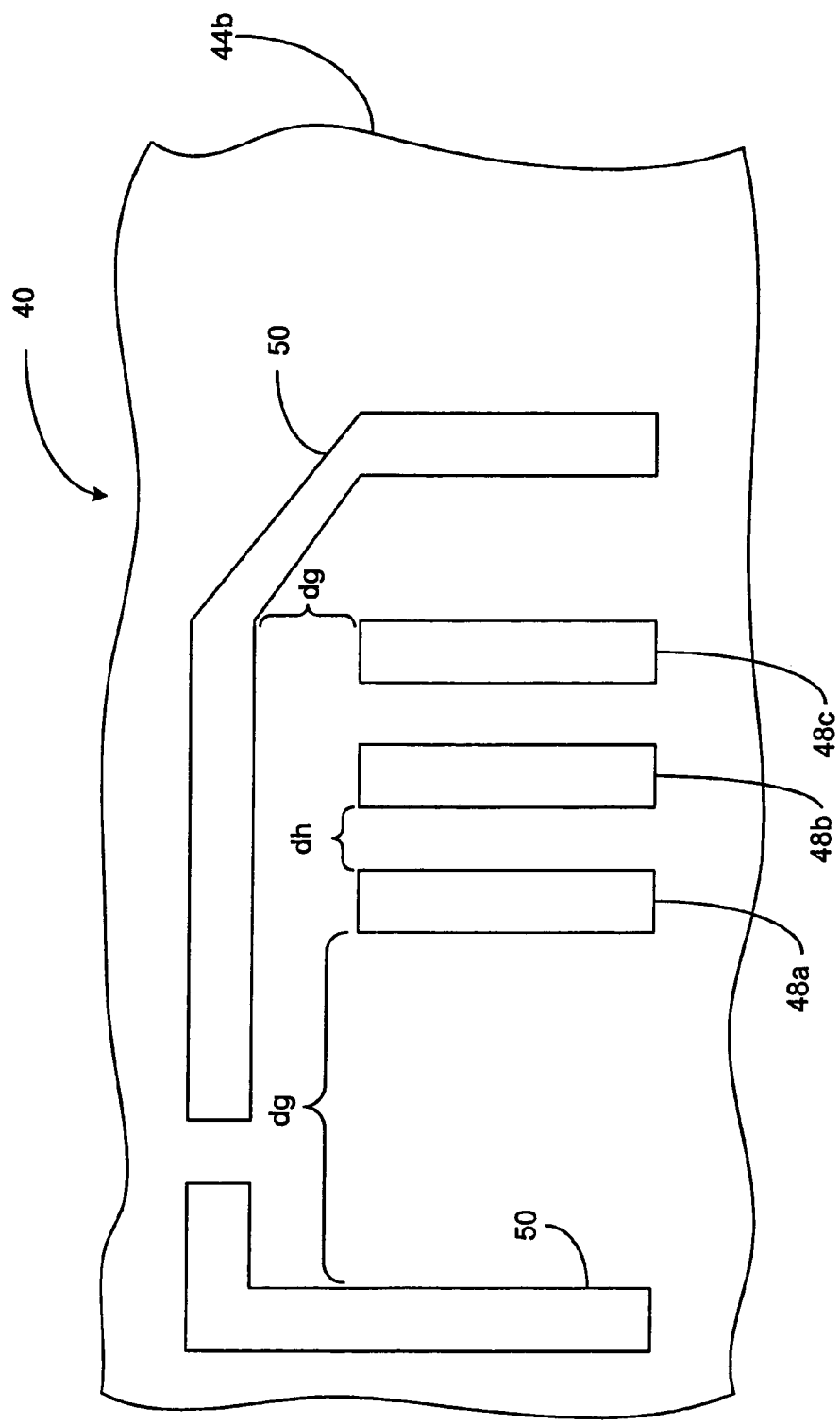
FIG. 3B illustrates a top-view of a presently preferred embodiment of a fringing capacitor in accordance with the principles of the invention.

Referring to FIGS. 3A and 3B, a second embodiment of a fringing capacitor 40 in accordance with the principles of the invention is illustrated. The fringing capacitor 40 is similar to fringing capacitor 20 in function with corresponding elements numbered in the range 40–49, except that fringing capacitor 40 includes a guardband 50 for attenuating coupling between the fringing capacitor 40 and external electromagnetic fields. The guardband 50 is preferably formed from a conductive material such as polysilicon, aluminum, and copper. In the preferred embodiment, the guardband 50 is provided on each conducting layer 44 and substantially encircles the electrodes of fringing capacitor 40. However, the scope of the invention includes providing the guardband on less than all of the conducting layers 44, and only running the guardband 50 along one side of the fringing capacitor 40. In addition, the guardband 50 may be included on layers either above or below the fringing capacitor. Preferably, the guardband 50 is spaced from the conductors a distance dg that is approximately twice the distance dh between adjacent conductor legs 48. The distance dg is selected to minimize the parasitic fringing capacitance that is formed between the guardband 50 and the conductor legs 48, while at the same time maintaining a volumetrically efficient fringing capacitor 40. To maintain a predetermined ratio between the capacitance of the fringing capacitor 40 and the parasitic capacitance formed from the guardband 50, the distance dg is preferably increased when there are fewer conductor layers 44 or conductor legs 48, and the distance dg is preferably decreased when there are more conductor layers 44 or conductor legs 48. Preferably the line width of the guardband 50 is selected to be the same as the conductor legs 48, however the scope of the invention is not limited by the line width that is selected. Preferably the guardband 50 is coupled through a low impedance to a voltage potential such as ground reference, however the scope of the invention includes permitting the guardband to float with respect to system voltage potentials.

Referring to FIG. 4A, an embodiment of a split-capacitance fringing capacitor 70 in accordance with the principles of the invention is shown. The split fringing capacitor 70 is particularly suitable in matched capacitor applications such as sample and hold capacitors, capacitor arrays in D/A and A/D converters, and especially multiplying D/A converters. The split-capacitance fringing capacitor 70 includes a first fringing capacitor 80 and a second fringing capacitor 100. The first fringing capacitor 80 is similar to fringing capacitor 20 in structure with corresponding elements numbered in the range 80–89, except that fringing capacitor 80 divides the conductor legs 88 to form two capacitors C1 and C2'. The second fringing capacitor 100 is also similar to fringing capacitor 20 in structure with corresponding elements numbered in the range 100–109, except that fringing capacitor 100 likewise divides the conductor legs 108 to form two capacitors C2 and C1'. Capacitors C1 and C1' are interconnected forming a first capacitor, and capacitors C2 and C2' are interconnected forming a second capacitor. Preferably, C1, C1', C2, and C2' have equivalent capacitances, however the scope of the invention includes forming the capacitors with dissimilar capacitances as well as asymmetrical capacitances such as C1=C2 and C1'=C2', or C1=C2=C1'=C2'.

Figure 4B:
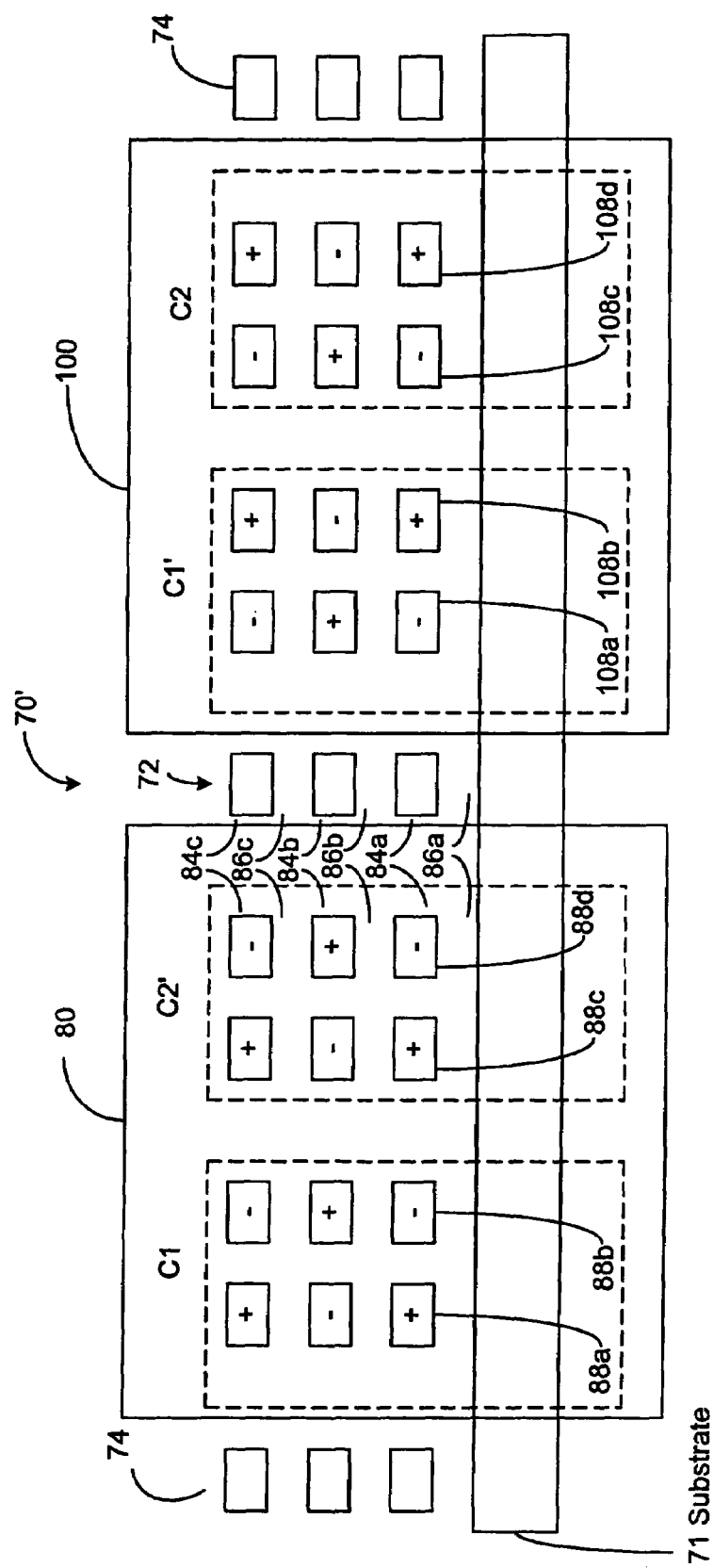

Referring to FIG. 4B, another embodiment of a split-capacitance fringing capacitor 70' in accordance with the principles of the invention is shown. The split fringing capacitor 70' is similar to split fringing capacitor 70, except that split fringing capacitor 70' includes guardbands 72 and 74 to shield the components of the split fringing capacitor 70'.

Figure 4C:
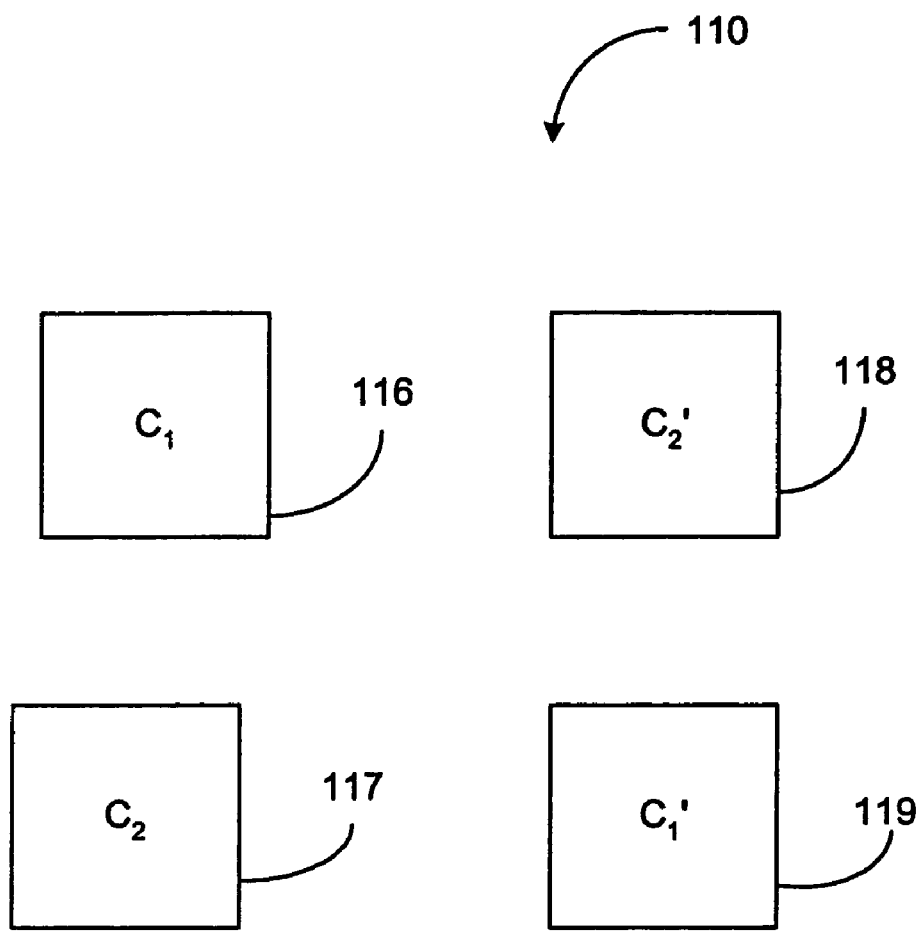

Referring to FIG. 4C, a top-view of an embodiment of a split-capacitance fringing capacitor 110 in accordance with the principles of the invention is shown. The split-capacitance fringing capacitor 110 includes four fringing capacitors 116–119, preferably arranged side-by-side forming a two-by-two square. The fringing capacitors 116–119 are similar in function and construction to fringing capacitors described in earlier sections of this specification. Preferably, one capacitor of a set of matched capacitors is formed by cross-connecting the fringing capacitors 116 and 119. A second capacitor of a set of matched capacitors is formed by cross-connecting the fringing capacitors 117 and 118. Cross-connecting the fringing capacitors minimizes the impact of coupling between the fringing capacitors 116–119 and external electromagnetic fields.

Figure 5:
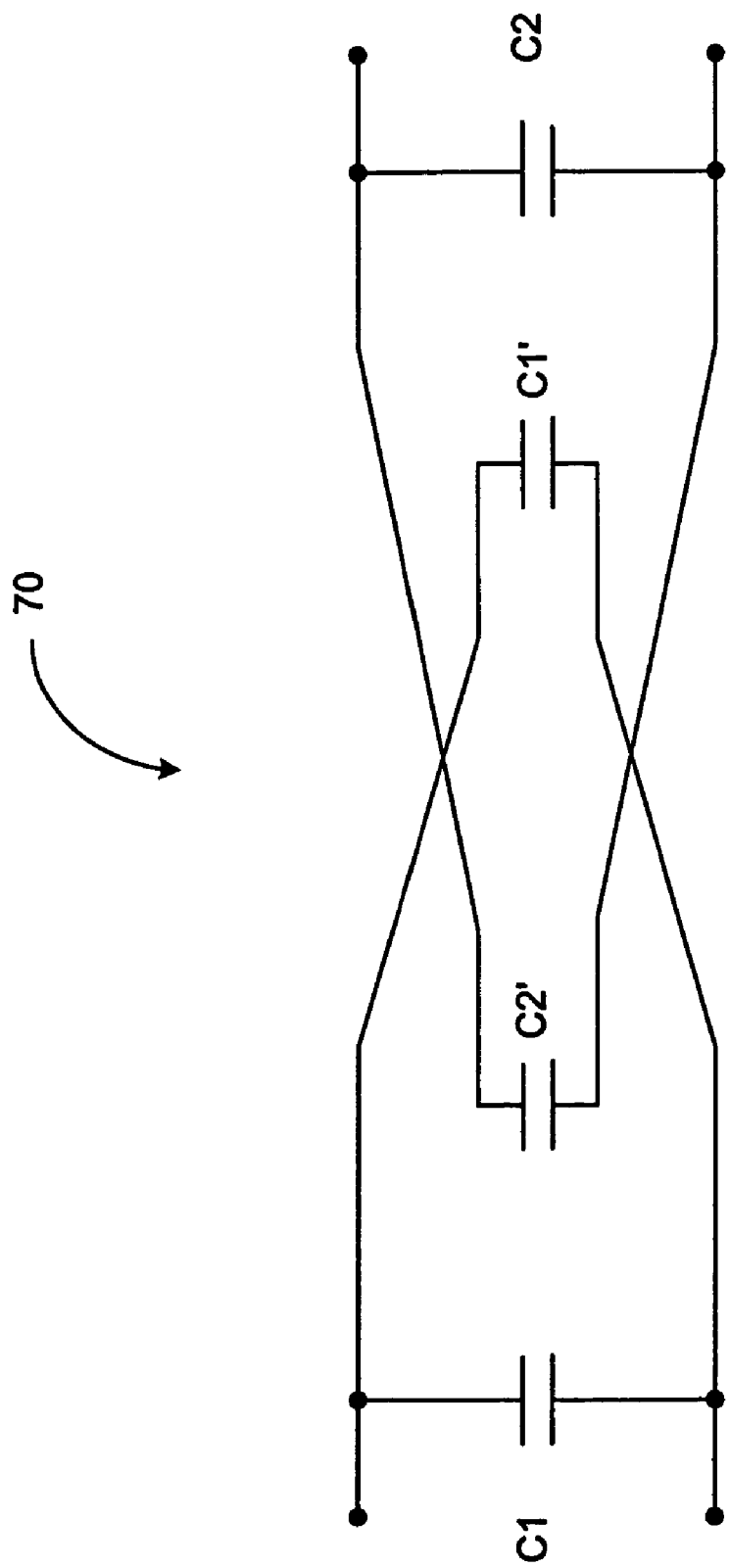
FIG. 5 is a schematic diagram that represents a split-capacitance embodiment of a fringing capacitor in accordance with the principles of the invention.

Additionally referring to FIG. 5, capacitors C1 and C1' are interconnected forming capacitor Ca, and capacitors C2 and C2' are interconnected forming capacitor Cb. Preferably, C1, C1', C2, and C2' have equivalent capacitances, however the scope of the invention includes forming the capacitors with dissimilar capacitances as well as asymmetrical capacitances such as C1=C2 and C1'=C2', or Ca Cb and C1 C2 C1' C2'. Preferably, a guardband 72 in accordance with the above description related to fringing capacitor 40, is interposed between the first and second fringing capacitors 80 and 100 to attenuate coupling between the two fringing capacitors 80 and 100. In addition, outer guardbands 74 in accordance with the above description, preferably encircle the split-capacitance fringing capacitor 70'. Preferably, the fringing capacitors 80 and 100 include an even number of ten or more conductor legs 88 and 108 on three or more conductor layers 84 to facilitate splitting the capacitors into even valued devices, providing a matching property for the split-capacitance fringing capacitor 70' of about 0.1%. Increasing the number of conductor legs 88 and 108, and maintaining an even number of conductor legs 88 and 108 improves the matching property of the split-capacitance fringing capacitor 70'.

Thus it will be appreciated from the above that as a result of the present invention, a circuit and method for constructing a capacitor is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A method of constructing matched capacitors, comprising:
    forming at least two fringing capacitors including at least two portions being defined by a conductive material;
    dividing the portions of each of the at least two fringing capacitors to form a first split capacitor and a second split capacitor;
    coupling the first split capacitor of a first one of the fringing capacitors to the second split capacitor of a second one of the fringing capacitors to form a first matched capacitor; and
    coupling the second split capacitor of the first one of the fringing capacitors to the first split capacitor of the second one of the fringing capacitors to form a second matched capacitor.

2. The method of claim 1 further comprising the steps of:
    arranging the first split capacitor of the first one of the fringing capacitors adjacent to the second split capacitor of the second one of the fringing capacitors and the second split capacitor of the first one of the fringing capacitors; and
    arranging the second split capacitor of the first one of the fringing capacitors adjacent to the first split capacitor of the second one of the fringing capacitors and the first split capacitor of the first one of the fringing capacitors.

3. The method of claim 2 wherein forming one of the split capacitors includes;
    forming a first conductor layer;
    patterning the first conductor layer such that at least two portions are formed thereon, the portions including odd ones alternating with even ones, adjacent odd ones and even ones of the portions spaced apart such that an intralayer capacitance is formed;
    forming a first dielectric layer over the first conductor layer;
    forming a second conductor layer over the first dielectric layer;
    patterning the second conductor layer similar to the first conductor layer such that portions formed thereon substantially overlay the portions formed on the first conductor layer, whereby an interlayer capacitance is formed between the first conductor layer and the second conductor layer;
    forming a second dielectric layer over the second conductor layer; and
    interconnecting the odd ones of the portions on the first conductor layer to the even ones of the portions on the second conductor layer, thereby defining a first electrode;
    interconnecting the even ones of the portions on the first conductor layer to the odd ones of the portions on the second conductor layer, thereby defining a second electrode.

4. The method of claim 3 wherein the first split capacitor and the second split capacitor of the fringing capacitors are approximately equal.

5. The method of claim 2 wherein each of the fringing capacitors includes an even number of portions.

6. The method of claim 2 further comprising forming a guardband.

7. A method of forming a semiconductor capacitor, comprising:
    forming a first conductor layer;
    patterning the first conductor layer such that at least two portions are formed thereon, the portions including odd ones alternating with even ones, adjacent odd ones and even ones of the portions spaced apart;
    forming a first dielectric layer over the first conductor layer;
    forming a second conductor layer over the first dielectric layer;
    patterning the second conductor layer similar to the first conductor layer such that portions formed thereon substantially overlay the portions formed on the first conductor layer;
    forming a second dielectric layer over the second conductor layer; and
    interconnecting the odd ones of the portions on the first conductor layer to the even ones of the portions on the second conductor layer, thereby defining a first electrode;
    interconnecting the even ones of the portions on the first conductor layer to the odd ones of the portions on the second conductor layer, thereby defining a second electrode; and
    forming a guardband.

8. The method of claim 7 wherein the guardband is comprised of a conductive material.

9. The method of claim 7 further comprising the steps of:
    spacing the guardband approximately a predetermined distance dg from the first and second electrodes;
    spacing the adjacent odd ones and even ones of the prortions apart approximately a predetermined distance dh;
    wherein the distance dg is selected to be about twice the distance dh.

10. The method of claim 9 wherein the step of forming a guardband includes forming the guardband on one of the first conductor layer and the second conductor layer.

* * * * *

UNITED STATES PATENT AND TRADEMARK OFFICE
CERTIFICATE OF CORRECTION

PATENT NO.        : 6,974,744 B1  
APPLICATION NO. : 10/836389  
DATED              : December 13, 2005  
INVENTOR(S)      : Aram et al.

It is certified that error appears in the above-identified patent and that said Letters Patent is hereby corrected as shown below:

Column 1, Line 57:    Delete "," after "adjacent"

Signed and Sealed this

Fifteenth Day of August, 2006

JON W. DUDAS  
*Director of the United States Patent and Trademark Office*